(12) United States Patent
Lee

(10) Patent No.: US 7,371,678 B2
(45) Date of Patent: May 13, 2008

(54) SEMICONDUCTOR DEVICE WITH A METAL LINE AND METHOD OF FORMING THE SAME

(75) Inventor: June-Woo Lee, Osan (KR)

(73) Assignee: Dongbu Electronics Co., Ltd., Seoul (KR)

( * ) Notice: Subject to any disclaimer, the term of this patent is extended or adjusted under 35 U.S.C. 154(b) by 321 days.

(21) Appl. No.: 11/320,587

(22) Filed: Dec. 30, 2005

(65) Prior Publication Data

US 2006/0148236 A1 Jul. 6, 2006

(30) Foreign Application Priority Data

Dec. 30, 2004 (KR) .................. 10-2004-0117417

(51) Int. Cl.
*H01L 21/4763* (2006.01)
*H01L 23/48* (2006.01)

(52) U.S. Cl. .................. 438/622; 438/624; 257/758; 257/760

(58) Field of Classification Search .................. 438/618, 438/622, 624, 625, 631, 637, 638, 666; 257/750, 257/752, 758, 760

See application file for complete search history.

(56) References Cited

U.S. PATENT DOCUMENTS

| | | | |
|---|---|---|---|
| 6,693,319 B1 * | 2/2004 | Durcan et al. | 257/308 |
| 2001/0004552 A1 * | 6/2001 | Tang et al. | 438/689 |
| 2002/0048944 A1 * | 4/2002 | Tang et al. | 438/672 |
| 2004/0018714 A1 * | 1/2004 | Cooney et al. | 438/618 |

* cited by examiner

*Primary Examiner*—Kevin M Picardat
(74) *Attorney, Agent, or Firm*—Lowe Hauptman Ham & Berner LLP

(57) ABSTRACT

A semiconductor device with a metal line and a method of forming the same. The method includes forming an insulation layer on a semiconductor substrate including a predetermined lower structure, forming a vertical hole and a horizontal hole by etching the insulation layer, forming a supporting part by filling the vertical holes and horizontal holes with a nitride layer, and forming a damascene metal line layer by forming a metal line on the insulation layer. The method also includes performing the forming process for the damascene metal line layer a plurality of times, removing the insulation layer, and forming a protective layer on the highest layer of the damascene metal line layer.

17 Claims, 6 Drawing Sheets

SEMICONDUCTOR DEVICE WITH A METAL LINE AND METHOD OF FORMING THE SAME

CROSS-REFERENCE TO RELATED APPLICATION

This application claims priority to and the benefit of Korean Patent Application No. 10-2004-0117417 filed in the Korean Intellectual Property Office on Dec. 30, 2004, the entire contents of which are incorporated herein by reference.

BACKGROUND OF THE INVENTION (a) Field of the Invention

The present invention relates to a semiconductor device with a metal line and a method of forming the same. More particularly, the present invention relates to a method of forming a structure of an interlayer insulation layer.

(b) Description of the Related Art

Generally, metal lines in a semiconductor device connect circuits in a semiconductor substrate through an electrical connection and pad connection between semiconductor devices by using a thin metal layer composed of aluminum, an aluminum alloy, or copper.

In order to form such metal lines, a contact hole is formed by selectively etching an insulation layer, and a metal plug filling in the contact hole is formed by using a barrier metal and tungsten. The contact hole is formed so as to connect a device electrode and a pad which are separated by an insulation layer.

In addition, a thin metal layer is formed on the metal plug, and then a metal line for connecting a device electrode and a pad is finally formed by patterning the thin metal layer Recently, as semiconductor devices have become more miniaturized, a CD (critical dimension) of a metal line has also become smaller. However, even if a photolithography process is mainly used for patterning a metal line, it is very difficult to form a metal line having a fine pattern. Therefore, a damascene process is frequently used in order to easily form a metal line having a fine pattern.

According to a damascene process, a metal line having a fine pattern can be formed by the following processes. Firstly, a tungsten plug is formed in a contact hole at an insulation layer, and then an upper insulation layer such as an oxide layer is deposited on the insulation layer. Subsequently, only a portion of the upper insulation layer in the region where a metal line pattern will be formed is removed by a photolithography process, and then a thin metal layer is deposited on the entire surface of the upper insulation layer. A metal line is then formed by planarizing the thin metal film.

Recently, a dual damascene technique has been introduced for forming the metal wiring for contacting the lower conductive layer without forming the metal plug such as a tungsten plug.

An insulation layer required for forming a metal line may be composed of a USG (un-doped silicate glass) or FSG (fluorine silicate glass). However, as semiconductor devices have become more highly integrated, the thickness and width of an insulation layer thereof have been reduced. Therefore, interference between electrical signals transmitted through a metal line may frequently occur.

In addition, since the above-mentioned insulation layer has a dielectric constant of 3.9 to 4.2, the operation speed of a semiconductor device may be deteriorated due to the high dielectric constant.

On the other hand, when an insulation layer having a low dielectric constant, such as one made from CSG (carbonate silicate glass), FC (fluorine amorphous carbon), or HSQ (hydrogen silsesquioxane), is used for forming a metal line, yield of semiconductor devices may be deteriorated and manufacturing costs may be increased because the insulation layer having a low dielectric constant shows an unstable quality of the layer and because an additional process, such as a liner process, is required for preventing damage caused by a subsequent thermal process.

The above information disclosed in this Background section is only for enhancement of understanding of the background of the invention and therefore it may contain information that does not form part of the prior art with respect to the present invention.

SUMMARY OF THE INVENTION

The present invention has been made in an effort to provide a semiconductor device with a metal line, and a method of forming the same, having advantages of enhancing an operation speed of the semiconductor device.

An exemplary method of forming a metal line according to the present invention includes: forming an insulation layer on a semiconductor substrate including a predetermined lower structure; forming a vertical hole and a horizontal hole by etching the insulation layer; forming a supporting part by filling the vertical hole and the horizontal hole with a nitride layer; forming a damascene metal line layer by forming a metal line on the insulation layer; performing the forming process for the damascene metal line layer a plurality of times; removing the insulation layer; and forming a protective layer on the highest layer of the damascene metal line layer.

The supporting part may be formed so as to support the metal line.

A plurality of the horizontal holes can be formed on the single vertical hole.

The insulation layer can be an oxide layer.

The insulation layer can be removed by using a HF etchant.

A gap between the horizontal holes on the highest layer of the damascene metal line layer can be formed at 0.1 μm or less.

The nitride layer can be a SiN layer.

The SiN layer can be formed by using a PECVD method.

The PECVD method can be performed under a condition that $SiH_4$, $SiH_2Cl_2$, $NH_3$, or $N_2$ gas is used at a temperature of 300 to 450° C.

The protective layer can be composed of the oxide layer and the nitride layer.

An exemplary semiconductor device with a metal line according to the embodiment of the present invention includes: a semiconductor substrate having a predetermined lower structure; supporting parts formed on the semiconductor substrate; a plurality of damascene metal line layers including a metal line formed between the supporting parts; and a protective layer formed on the damascene metal line layer.

The supporting parts can be formed so as to support the metal line.

The supporting parts are composed of a SiN material.

The damascene metal line layer can use air as an insulating material.

The air has a dielectric constant of 1.

DETAILED DESCRIPTION OF THE EMBODIMENTS

Figure 1:
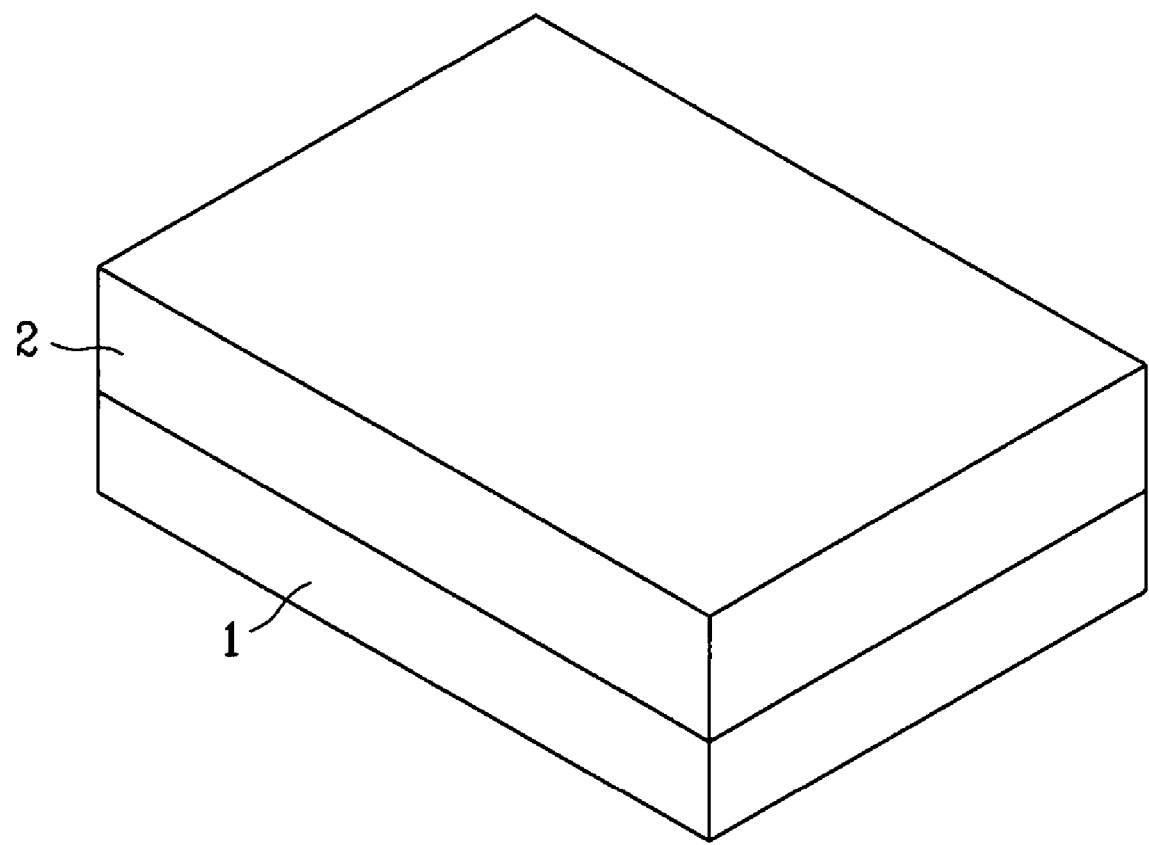
FIG. 1 to FIG. 6 are perspective views showing sequential stages of a method of forming a metal line in a semiconductor device according to an exemplary embodiment of the present invention.

With reference to the accompanying drawings, the present invention will be described in order for those skilled in the art to be able to implement the invention. As those skilled in the art would realize, the described embodiments may be modified in various different ways, all without departing from the spirit or scope of the present invention.

To clarify multiple layers and regions, the thicknesses of the layers are enlarged in the drawings. Like reference numerals designate like elements throughout the specification. When it is said that any part, such as a layer, film, area, or plate is positioned on another part, it means the part is directly on the other part or above the other part with at least one intermediate part. On the other hand, if any part is said to be positioned directly on another part, it means that there is no intermediate part between the two parts.

Hereinafter, a method of forming a metal line in a semiconductor device according to an exemplary embodiment of the present invention will be described with reference to the accompanying drawings.

FIG. 1 to FIG. 6 are perspective views showing sequential stages of a method of forming a metal line in a semiconductor device according to an exemplary embodiment of the present invention.

As shown in FIG. 1, a first oxide layer 2 is formed on a semiconductor substrate 1.

Figure 2:
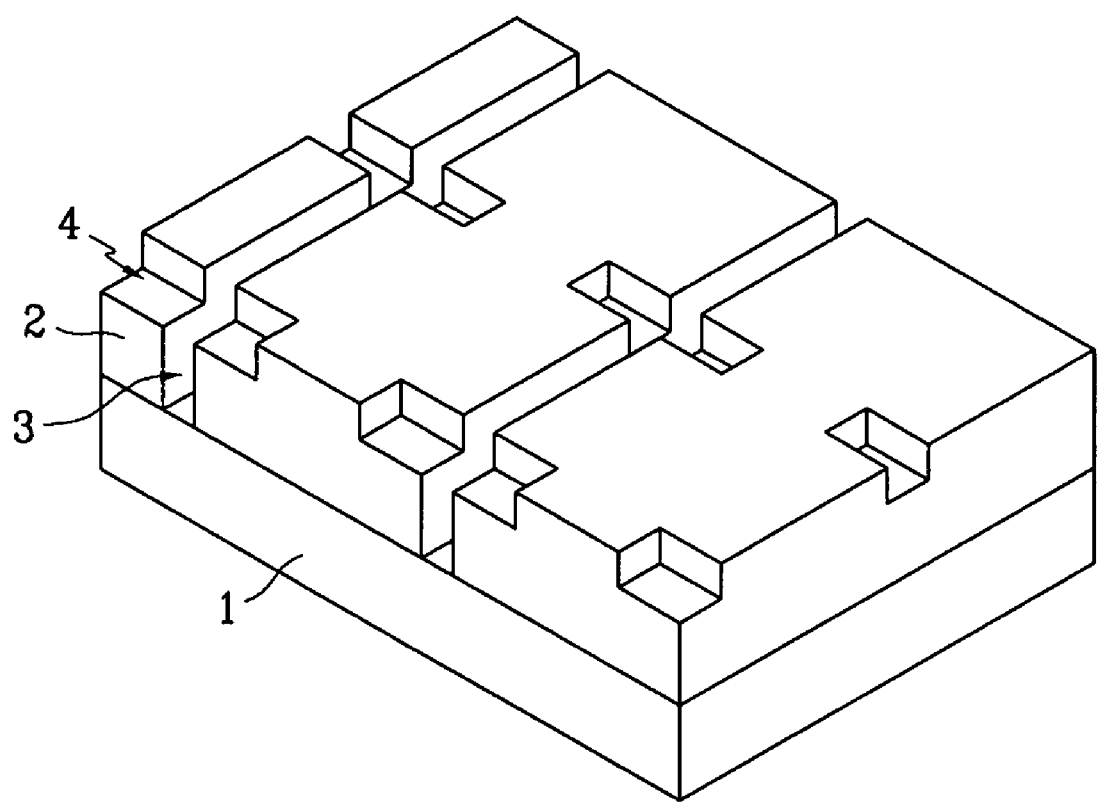

Subsequently, as shown in FIG. 2, a plurality of first vertical holes 3 standing perpendicular to the semiconductor substrate 1 are formed by etching the first oxide layer 2 using a photosensitive layer pattern thereon.

Thereafter, another photosensitive layer pattern is formed on the first oxide layer 2. A plurality of first horizontal holes 4 having horizontal directions with respect to the semiconductor substrate 1 are formed by etching the first oxide layer 2 using the photosensitive layer as a mask. A plurality of the first horizontal holes 4 are formed on a single first vertical hole 3.

Figure 3:
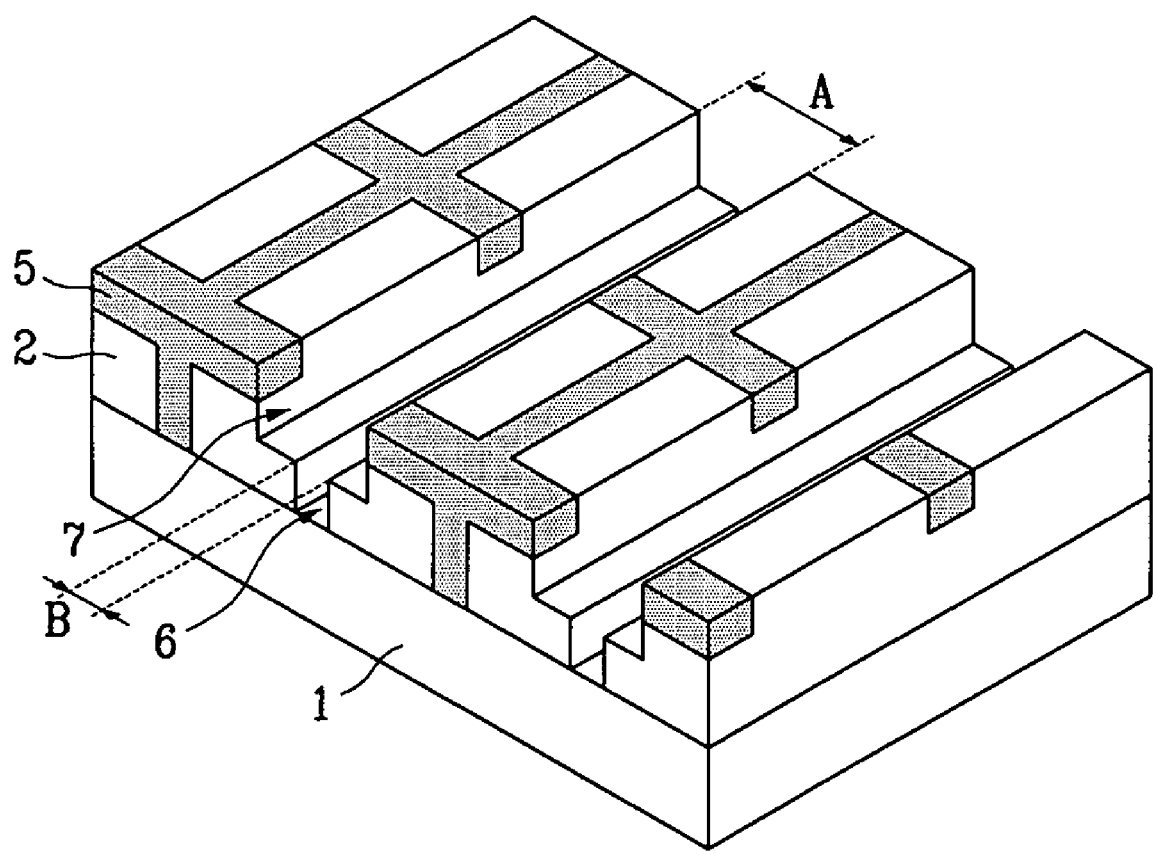

As shown in FIG. 3, a first supporting part 5 is formed by filling a nitride layer into the first vertical hole 3 and the first horizontal hole 4.

The first supporting part 5 is formed by using PECVD (plasma enhanced chemical vapor deposition).

If the first supporting part 5 is composed of SiN, it can be properly formed under the condition that $SiH_4$, $SiH_2Cl_2$, $NH_3$, or $N_2$ gas is used at a temperature of 300 to 450° C.

Subsequently, a first via hole 6 is formed by etching the first oxide layer 2 using the photosensitive layer as an etch mask, and by removing the photosensitive pattern. The photosensitive layer is opened only in the region B between the first vertical holes 4. Thereafter, a photosensitive layer is filled in the first via hole 6, and then a first trench 7 in which a first metal line will be formed is formed by etching the first oxide layer 2 using the photosensitive layer as an etch mask. The photosensitive layer is opened only in the region A between the first vertical holes 4. Subsequently, the photosensitive layer formed on the first oxide layer 2 and the photosensitive layer filling in the first via hole 6 are removed.

Figure 4:
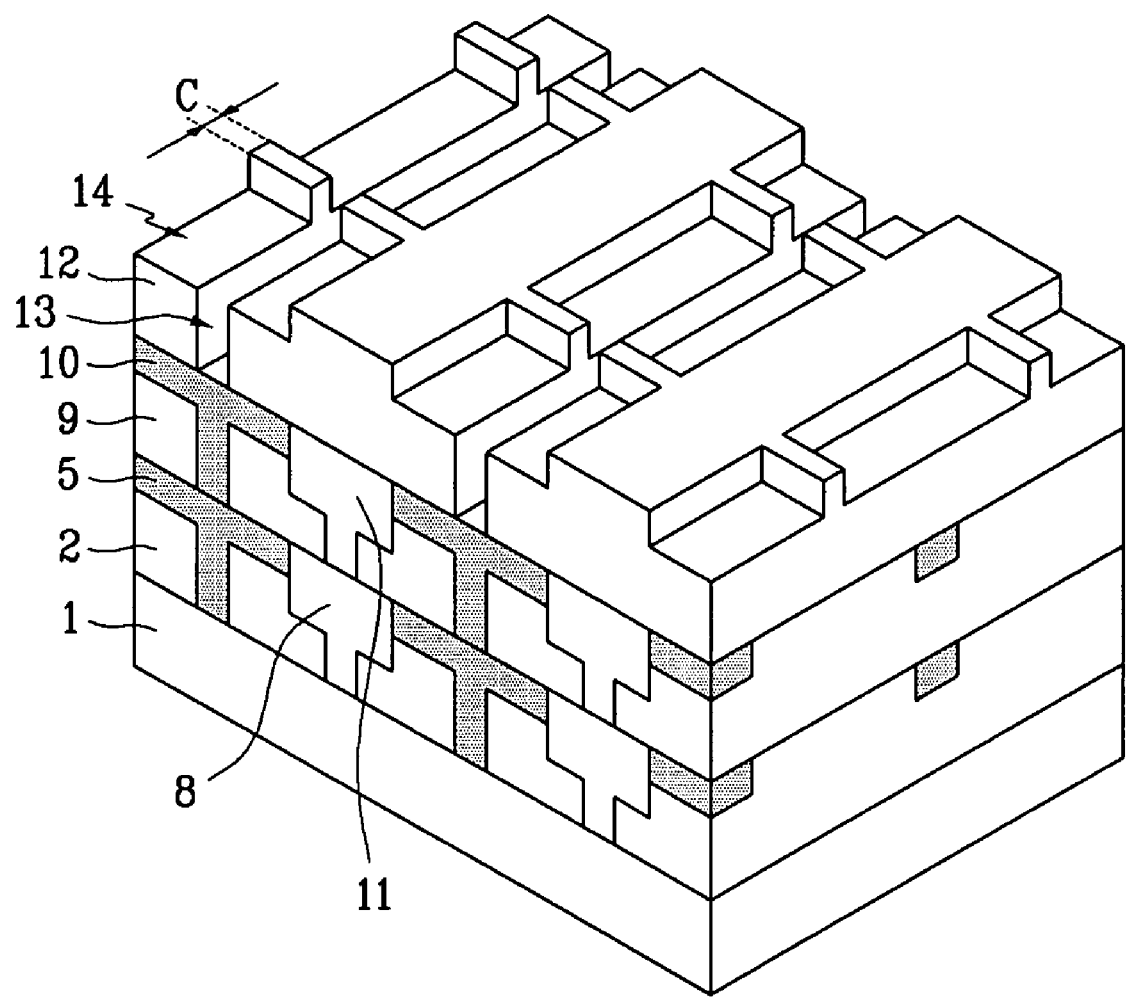

As shown in FIG. 4, a first metal line 8 is formed by filling a thin metal layer into the first via hole 6 and the first trench 7. Such a structure is referred to as a damascene metal line layer. Such damascene metal lines can have a multi-layered structure by repeating the above-mentioned processes.

Subsequently, a second oxide layer 9 is formed on an upper surface of the semiconductor substrate 1 including the damascene metal line.

A plurality of second vertical holes are formed by etching the second oxide layer 9 using a photosensitive layer pattern on the second oxide layer 9 as an etch mask to a degree that the nitride layer below the second oxide layer 9 is exposed, and then the photosensitive layer pattern is finally removed. The second vertical holes are formed above the positions of and in alignment with the first vertical holes 3.

Subsequently, after forming a photosensitive layer pattern on the second oxide layer 9, a plurality of the second horizontal holes are formed by etching the second oxide layer 9 using the photosensitive layer as a mask. A plurality of the second horizontal holes are formed on each single second vertical hole.

Thereafter, a second supporting part 10 is formed by filling the second vertical and horizontal holes with a nitride layer.

The second supporting part 10 is formed by using PECVD.

If the second supporting part 10 is composed of SiN, it can be properly formed under the condition that $SiH_4$, $SiH_2Cl_2$, $NH_3$, or $N_2$ gas is used at a temperature of 300 to 450° C.

Subsequently, a second via hole and a second trench are formed between the second horizontal holes, and then a second metal line 11 is formed by filling the second via hole and the second trench with a thin metal layer.

Thereafter, a third oxide layer 12 is formed on the entire surface of the semiconductor substrate 1.

A plurality of third vertical holes 13 are formed by etching the third oxide layer 12 using a photosensitive layer pattern thereon as an etch mask to a degree that the nitride layer below the third oxide layer 12 is exposed, and then the photosensitive layer pattern is finally removed. The third vertical holes 13 are formed above the second vertical holes and in parallel with the second vertical holes.

Subsequently, after forming a photosensitive layer pattern on the third oxide layer 12, a plurality of third horizontal holes 14 are formed by etching the third oxide layer 12 using the photosensitive layer as a mask.

According to an exemplary embodiment of the present invention, the third oxide layer 12 is the highest layer among the multi-layered damascene metal lines.

A plurality of the third horizontal holes 14 are formed on each third vertical hole 13. A gap between a plurality of the third horizontal holes 14 is formed at 0.1 µm or less. Accordingly, a protection oxide layer 18 can be formed on the highest layer among the multi-layered damascene metal lines by using an overhang in the subsequent process.

Figure 5:
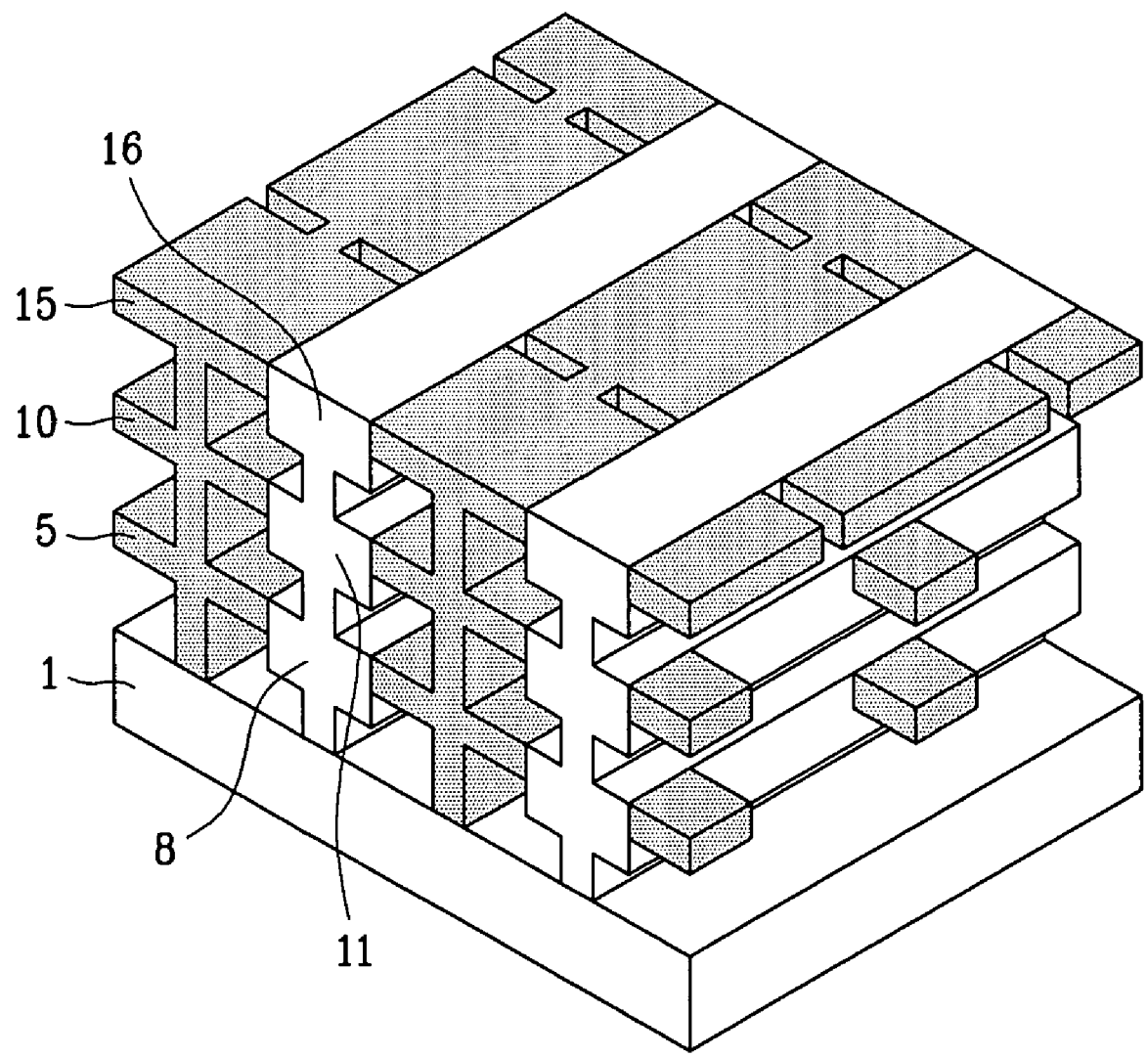

As shown in FIG. 5, a third supporting part 15 is formed by filling the third vertical holes 13 and the third horizontal holes 14 with the nitride layer.

The third supporting part 15 is formed by using PECVD.

If the third supporting part 15 is composed of SiN, it can be properly formed under the condition that $SiH_4$, $SiH_2Cl_2$, $NH_3$, or $N_2$ gas is used at a temperature of 300 to 450° C.

Subsequently, a third via hole and a third trench are formed between the third horizontal holes 14, and then a third metal line 16 is formed by filling the third via hole and the third trench with a thin metal layer.

Thereafter, the first, second, and third oxide layers 2, 9, and 12 are removed by using a HF etchant.

Accordingly, the first, second, and third supporting parts 5, 10, and 15 respectively support the first, second, and third metal lines 8, 11, and 16.

The structures of the first, second, and third supporting parts 5, 10, and 15 can be modified within a range such that a degree of strength for supporting a metal line can be maintained.

In addition, air having a dielectric constant of 1 can substitute for the first, second, and third oxide layer 2, 9, and 12. Therefore, an operation speed of the semiconductor device can be enhanced.

Figure 6:
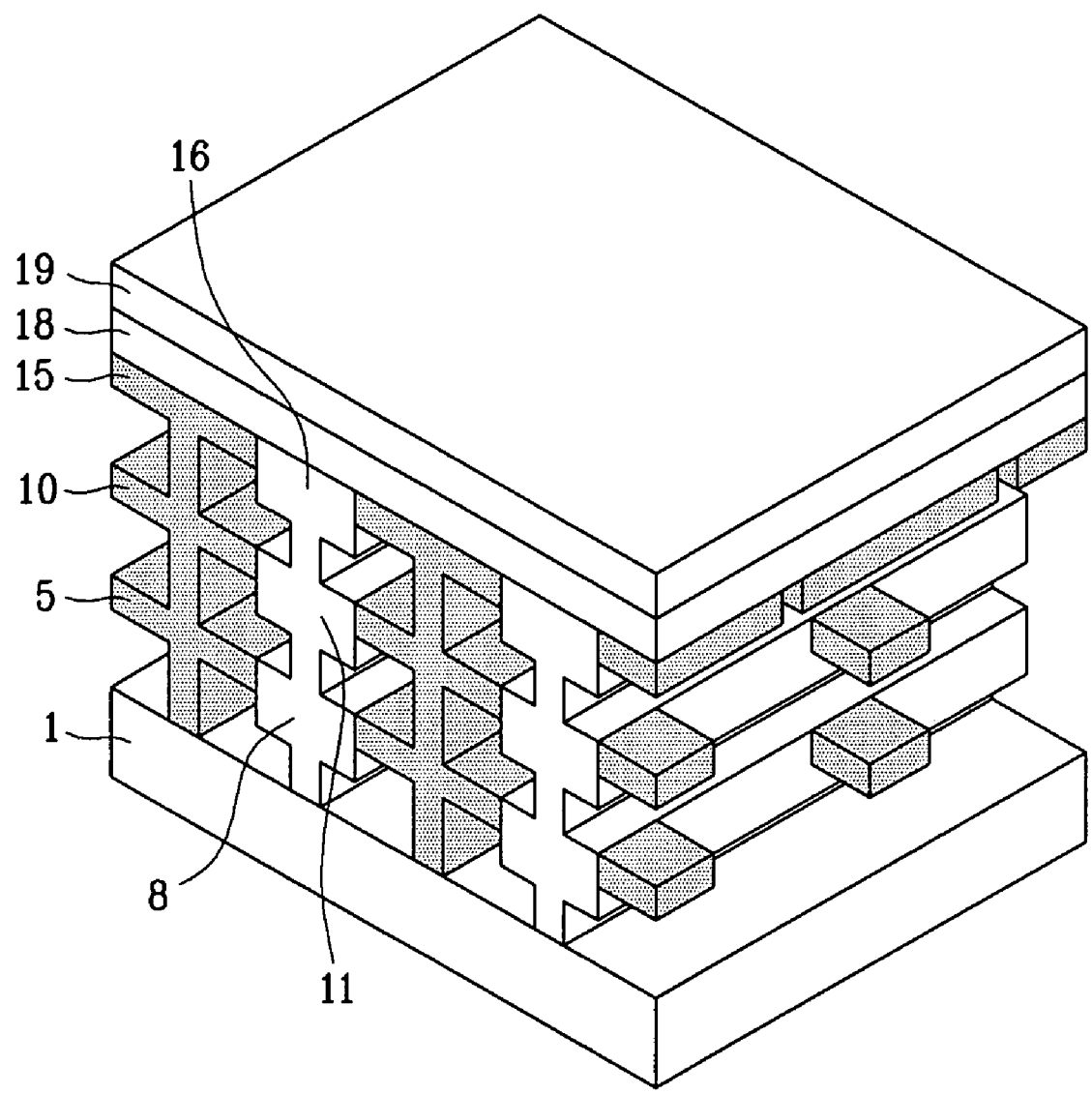

Subsequently, as shown in FIG. 6, the protection oxide layer 18 and a protection nitride layer 19 are sequentially formed on the third supporting part 15 and the third metal lines 16.

The protection oxide layer 18 and protection nitride layer 19 protect the semiconductor substrate 1 from light, chemicals, etc.

According to the present invention, supporting parts for metal lines having a multi-layered structure are formed, and then spaces between the metal lines and the supporting parts are filled with air having a dielectric constant of 1 rather than an insulation layer. Consequently, an operation speed of the semiconductor device can be enhanced.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of forming a metal line in a semiconductor device, comprising:
   forming an insulation layer on a semiconductor substrate including a predetermined lower structure;
   forming vertical holes and horizontal holes by etching the insulation layer;
   forming supporting parts by filling the vertical holes and horizontal holes with a nitride layer;
   forming a damascene metal line layer by forming a metal line on the insulation layer;
   performing the forming process for the damascene metal line layer a plurality of times;
   removing the insulation layer; and
   forming a protective layer on the highest layer of the damascene metal line layer.

2. The method of claim 1, wherein the supporting parts are formed so as to support the metal line.

3. The method of claim 1, wherein a plurality of the horizontal holes are formed on each vertical hole.

4. The method of claim 1, wherein the insulation layer is an oxide layer.

5. The method of claim 4, wherein the insulation layer is removed by using a HF etchant.

6. The method of claim 3, wherein a gap between the horizontal holes on the highest layer of the damascene metal line layer is formed at 0.1 μm or less.

7. The method of claim 1, wherein the nitride layer is a SiN layer.

8. The method of claim 7, wherein the SiN layer is formed by using a PECVD method.

9. The method of claim 8, wherein the PECVD method is performed under a condition that $SiH_4$, $SiH_2Cl_2$, $NH_3$, or $N_2$ gas is used at a temperature of 300 to 450° C.

10. The method of claim 1, wherein the protective layer is composed of the oxide layer and the nitride layer.

11. A semiconductor device, comprising:
    a semiconductor substrate having a predetermined lower structure;
    supporting parts formed on the semiconductor substrate;
    a plurality of damascene metal line layers including a metal line formed between the supporting parts; and
    a protective layer formed on the damascene metal line layer.

12. The semiconductor device of claim 11, wherein the supporting parts are formed by filling a nitride layer in vertical and horizontal holes which are formed by etching an insulation layer on the substrate.

13. The semiconductor device of claim 11, wherein the supporting parts are formed so as to support the metal line.

14. The semiconductor device of claim 11, wherein the supporting parts are composed of a SiN material.

15. The semiconductor device of claim 11, wherein the damascene metal line layer uses air as an insulating material.

16. The semiconductor device of claim 11, wherein the air has a dielectric constant of 1.

17. The semiconductor device of claim 11, wherein the protective layer is composed of an oxide layer and a nitride layer.

* * * * *